(12) United States Patent
Moon et al.

(10) Patent No.: US 8,026,737 B2
(45) Date of Patent: Sep. 27, 2011

(54) FUSING APPARATUS FOR CORRECTING PROCESS VARIATION

(75) Inventors: Yeon-Kug Moon, Seoul (KR); Jae-Ho Kim, Seoul (KR); Il-Yeup Ahn, Seoul (KR); Sang-Shin Lee, Seoul (KR); Min-Hwan Song, Seoul (KR); Kwang-Ho Won, Seoul (KR)

(73) Assignee: Korea Electronics Technology Institute, Gyeonggi-Do (KR)

( * ) Notice: Subject to any disclaimer, the term of this patent is extended or adjusted under 35 U.S.C. 154(b) by 0 days.

(21) Appl. No.: 12/648,908

(22) Filed: Dec. 29, 2009

(65) Prior Publication Data

US 2011/0156747 A1 Jun. 30, 2011

(30) Foreign Application Priority Data

Dec. 28, 2009 (KR) .................. 10-2009-0131631

(51) Int. Cl.
*H03K 19/00* (2006.01)

(52) U.S. Cl. .................. 326/16; 327/525; 365/225.7

(58) Field of Classification Search .................. 326/16, 326/56–60, 81, 83, 86; 327/525–526; 365/225.7
See application file for complete search history.

(56) References Cited

U.S. PATENT DOCUMENTS

| 4,532,607 | A | * | 7/1985 | Uchida | 365/96 |
| 6,108,751 | A | * | 8/2000 | Lee et al. | 711/115 |
| 6,147,546 | A | * | 11/2000 | Verwegen | 327/525 |
| 6,400,208 | B1 | * | 6/2002 | Lesher et al. | 327/525 |
| 6,794,909 | B1 | * | 9/2004 | Urakami et al. | 327/112 |
| 7,307,911 | B1 | * | 12/2007 | Anand et al. | 365/225.7 |
| 7,940,116 | B2 | * | 5/2011 | Park | 327/525 |
| 2003/0080780 | A1 | * | 5/2003 | Okamoto et al. | 326/83 |
| 2005/0189970 | A1 | * | 9/2005 | Nakatake et al. | 327/143 |

* cited by examiner

*Primary Examiner* — Shawki Ismail
*Assistant Examiner* — Crystal L Hammond
(74) *Attorney, Agent, or Firm* — Ohlandt, Greeley, Ruggiero & Perle, L.L.P.

(57) ABSTRACT

An fusing apparatus for correcting process variation is provided. The fusing apparatus for correcting the process variation of the semiconductor device includes a fusing part including a fusing resistor fused by a current penetrating; a current driving transistor for fusing the fusing resistor by driving a fusing current according to a fusing enable signal applied; a current path part for building a current path by connecting to the fusing part, and controlling a first node voltage according to a fusing state of the fusing resistor; and a latch part for latching a second node signal inversely amplified from the first node voltage, and outputting the latch value when a power-on reset part operates in a normal mode. Using the fusing cell, the test time can be reduced and the current consumption can be greatly decreased in the fusing process.

10 Claims, 2 Drawing Sheets

US 8,026,737 B2

FUSING APPARATUS FOR CORRECTING PROCESS VARIATION

PRIORITY

This application claims the benefit under 35 U.S.C. §119(a) to a Korean patent application filed in the Korean Intellectual Property Office on Dec. 28, 2009 and assigned Serial No. 10-2009-0131631, the entire disclosure of which is hereby incorporated by reference.

BACKGROUND OF THE INVENTION

1. Field of the Invention

The present invention relates generally to an fusing apparatus for correcting process variation. More particularly, the present invention relates to an fusing apparatus for correcting process variation, which can reduce a test time and a consumed current when the process variation of the semiconductor device is corrected.

2. Description of the Related Art

When a fabrication process of a semiconductor device is completed, a semiconductor device test is applied to semiconductor devices formed on semiconductor substrates to measure their characteristics. In a semiconductor manufacturing company, FAB characteristics vary in a production line per foundry service provider and the process variation occurring in the production process is the main cause which increases the manufacturing cost of the semiconductor manufacturers. In particular, the cost required to add various circuits and blocks to correct the process variation considerably affects the manufacturing cost of the semiconductor device. Thus, various techniques are under process to lower the manufacturing cost of the semiconductor device. Particularly, a technique for decreasing the manufacturing cost by correcting the process variation is demanded.

SUMMARY OF THE INVENTION

An aspect of the present invention is to address at least the above mentioned problems and/or disadvantages and to provide at least the advantages described below. Accordingly, an aspect of the present invention is to provide an apparatus for correcting process variation of a semiconductor device, which can shorten a test time and reduce a current consumed in a fusing process when the process variation of the semiconductor device is corrected.

According to one aspect of the present invention, an fusing apparatus for correcting process variation includes a fusing part including a fusing resistor fused by a current penetrating; a current driving transistor for fusing the fusing resistor by driving a fusing current according to a fusing enable signal applied; a current path part for building a current path by connecting to the fusing part, and controlling a first node voltage according to a fusing state of the fusing resistor; and a latch part for latching a second node signal inversely amplified from the first node voltage, and outputting the latch value when a power-on reset part operates in a normal mode.

The fusing apparatus for correcting the process variation further includes an input logic gate part for output a low logic state regardless of an external data value when the fusing enable logic sate is high; and a first inverter comprising a PMOS transistor MP1 and an NMOS transistor MN2 connected to an output terminal of the input logic gate part with a gate, connected to a gate of the current driving transistor with a drain, and enabling the current driving transistor by controlling the logic state of the gate of the current driving transistor.

The input logic gate part may include a first NAND gate for receiving an inverted signal of the fusing enable signal and an inverted signal of the external data signal; and an inverter for inverting the inverted signal of the external data signal.

The current driving transistor may be connected to an output terminal of the first inverter with a gate, connected to a power supply with a drain, connected to the fusing part with a source, and supply the fusing current to the fusing part when the gate logic is high.

The current path part may include a PMOS transistor MP3 connected to a power supply with a source and connected to the latch part with a gate; an NMONS transistor MN4 connected to the first node with a drain and connected to the latch part with a gate; and a reference resistor R1 connected between the drain of the NMOS transistor MN4 and the drain of the PMOS transistor MP3. A current path is established or disconnected between a power supply and the fusing part according to logic states of the gate of the PMOS transistor MP3 and the gate of the NMOS transistor MN4 connected to the latch part.

When the fusing part is not fused and the power-on reset signal is high, the PMOS transistor MP3 may be turned off and the NMOS transistor MN4 may be turned on so that the current path is cut, and the first node may sustain low.

When the fusing part is fused and the power-on reset signal is high, the PMOS transistor MP3 may be turned on and the NMOS transistor MN4 may be turned off so that the current path is cut, and the first node may sustain high.

The latch part may include a second inverter comprising a PMOS transistor MP5 and an NMOS transistor MN6 connected to the first node with a gate for inversely amplifying the gate voltage and outputting the amplified gate voltage to a second node; a second NAND gate for receiving the power-on reset signal and the second node signal; an inverter IC4 for inverting an output signal of the second NAND gate and connected to the gate of the PMOS transistor MP5 of the current path part with an output terminal; a third NAND gate connected to the gate of the NMOS transistor MN4 of the current path part with an output terminal, and receiving the power-on reset signal and the inverted signal of the second node signal; and a fourth NAND gate for latching the second node voltage by receiving the second node signal and an external data signal, and outputting the latch value.

When the fusing resistor is fused by the fusing current, the logic state of the first node voltage may be changed to high.

The fusing resistor may be exceed 0 ohm and below 40 ohm.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will become more apparent from the following detailed description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
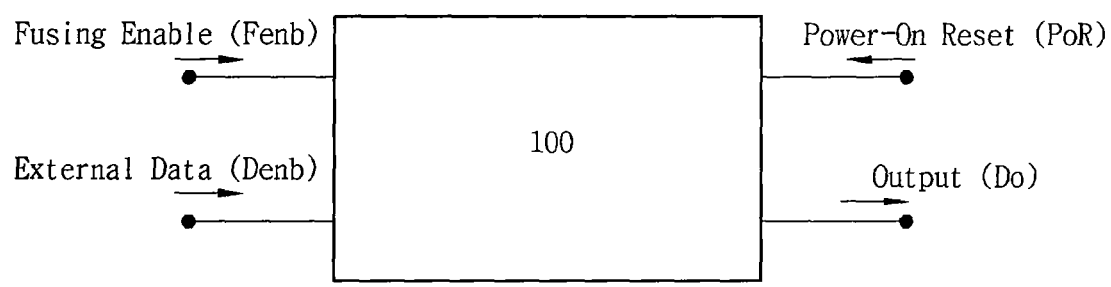
FIG. 1 is a diagram of relation between input and output signals of a fusing apparatus for correcting a process variation according to an exemplary embodiment of the present invention.

FIG. 1 is a diagram of the relation between input and output signals of a fusing apparatus for correcting a process variation according to an exemplary embodiment of the present invention.

Referring to FIG. 1, signals input to a fusing apparatus for correcting a process variation 100 (hereafter, referred to as a fusing cell) according to an exemplary embodiment of the present invention include a fusing enable (Fenb) signal, an external data (Denb) signal, and a power-on reset (PoR) signal. An output (Do) signal corresponds to the input signals.

The input signal and the output signal are input in a digital logic form and output as a digital logic form. Before a semiconductor device is tested, the input signal and the output signal can be initialized to the initial logic state in advance. For example, when the signal is not yet fused at the initial stage, the logic state of the fusing enable (Fenb) stage can be set to High and the power-on reset (PoR) stage can be set to Low. With the semiconductor device to test, when the necessary of the correction is determined according the test result, the power-on reset (PoR) signal of High is input and thus the power is applied to the fusing cell 100, and the fusing enable (Fenb) signal of Low is input and thus the fusing process can be carried out. The result of the fusing process can be output in the logic state from through the output (D0) stage. Since the fusing cell 100 can output a certain latch value corresponding to the fusing enable (Fenb) signal during one cycle, the test time taken to correct the process variation can be reduced.

Figure 2:
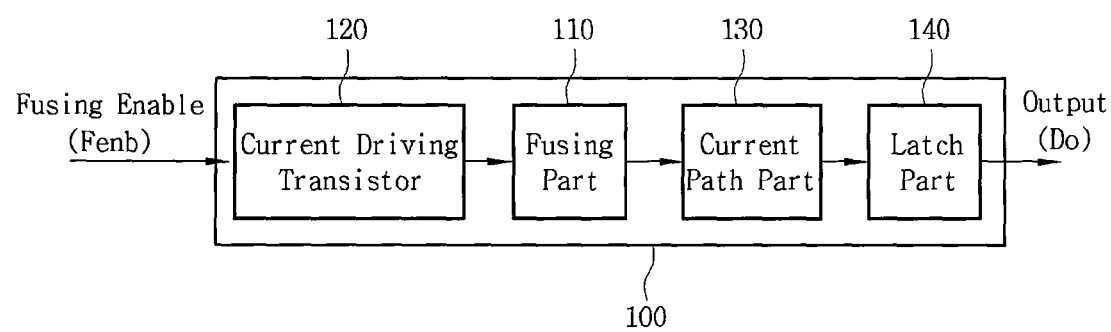
FIG. 2 is a main block diagram of a fusing apparatus for correcting a process variation of FIG. 1.

FIG. 2 is a main block diagram of the fusing apparatus for correcting a process variation of FIG. 1. Referring to FIG. 2, the fusing cell 100 includes a fusing part 110, a current driving transistor 120, a current path part 130, and a latch part 140.

The fusing part 110 includes a fusing resistor. The fusing resistor is disconnected or burned off by the penetrating current. Accordingly, when one-cycle fusing process is conducted, the resistance of the fusing resistor becomes even greater than before the fusing.

The current driving transistor 120 fuses the fusing resistor by driving the fusing current when the external fusing enable (Fenb) signal is applied. The applied fusing enable (Fenb) signal controls the gate logic state of the current driving transistor 120 so as to turn on and off the current driving transistor 120. When the gate logic state is high, the transistor is turned on and instantaneously passes the current supplied from an external power supply (VDD) to the fusing part 110.

The current path part 130 establishes the path of the current flowing between the power supply (VDD) and the ground plane together with the fusing part 110. The construction of the current path shall be described by referring to FIG. 3. Depending on the fusing state of the fusing part 110, a first node N1 voltage of the current path part 130 can be controlled. The first node N1 voltage is below about 500 mV before the fusing process, and the logic state of the first node N1 prior to the fusing process can be set to be recognized as low. After the fusing process, the logic state of the first node N1 can be recognized as high.

The latch part 140 can include a plurality of NOT logic gates and NAND gates. The latch part 140 latches a second node signal converted and amplified from the first node voltage of the current path part 130. The latched signal outputs the latch value to the output (Do) stage when the power-on reset part operates in a normal mode.

Figure 3:
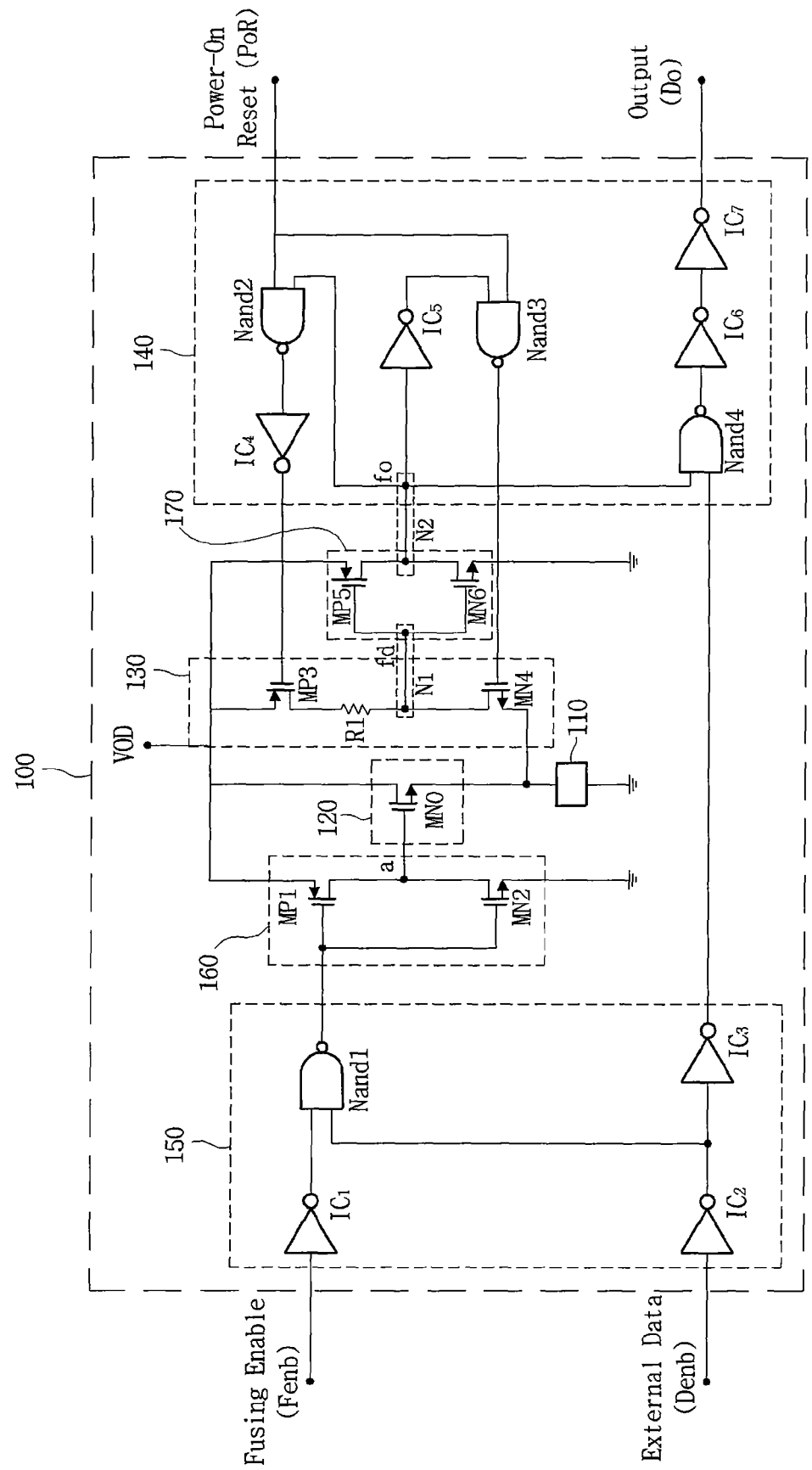
FIG. 3 is a circuit diagram of a fusing apparatus for correcting a process variation of FIG. 2.

FIG. 3 depicts the circuit of the fusing cell 100 according to an exemplary embodiment of the present invention. FIG. 3 is a circuit diagram of the fusing apparatus for correcting a process variation of FIG. 2. The signals input to and output from the fusing cell 100 have been explained in FIG. 1.

Referring to FIG. 3, an input logic gate part 150 includes an inverter IC1 which converts the fusing enable signal, an inverter IC2 which converts the external data signal, a first NAND gate Nand1 which receives the inverted signal of the fusing enable signal and the inverted signal of the external data signal, and an inverter IC3 which re-inverts the inverted signal of the external data signal.

A first inverter 160 includes an NMOS transistor MN2 and a PMOS transistor MP1 with their gate connected to the output terminal of the first NAND gate Nand1 and constituting a pair of complementary MOS transistors. The first inverter 160 enables the current driving transistor 120 according to the voltage of the node a. When the fusing cell 100 does not perform the fusing process at the initial stage, the fusing enable (Fenb) signal is high and the gate of the NMOS transistor MN2 and the gate of the PMOS transistor MP1 are connected to the first NAND gate Nand1 and are high regardless of the external data Denb. Hence, the node a is low and the current driving transistor MN0 120 is disabled.

In the current driving transistor 120, the gate is connected to the drain of the NMOS transistor MN2 and the drain of the PMOS transistor MP1, the drain is connected to the power supply VDD, and the source can use an NMOS transistor connected to the fusing part 110. When the current driving transistor 120 is turned on, the instant current can flow to the fusing part 110.

As for the on or off of the current driving transistor 120, when the fusing enable (Fenb) signal is high, the input of the first inverter 160 is high by the first inverter IC1 and the first NAND gate Nand1 irrespective of the external data Denb. Thus, the gate of the current driving transistor MN0 120 connected to the output terminal of the first inverter 160 is low. In this case, the current driving transistor MN0 120 is off and thus cannot flow the current to the fusing part 110.

The current path part 130 includes a PMOS transistor MP3 (hereafter, referred to as an MP3), a reference resistor R1, and an NMOS transistor MN4 (hereafter, referred to as an MN4). The MP3 is connected to the power supply VDD with its source and connected to one terminal of the reference resistor R1 with its drain. The drain of the MN4 is connected to the other terminal of the reference resistor R1 connected to the MP3 with one terminal. The source of the MN4 is connected to the fusing part 110 and the current driving transistor MN0 120.

When both of the MP3 and the MN4 are turned on by the gate logic of the MP3 and the MN4 gate logic, the MP3, the R1, the MN4, and the fusing part 110 build the current path between the power supply VDD and the ground plane. The current path can be disconnected according to the turn-on or turn-off of the MP3 and the MN4. For example, when the MP3 or the MN4 is off, the current path is disconnected. Through the disconnection or the establishment of the current path, the fusing cell 100 consumes some current only at the initial fusing time and consumes zero current after the remaining fusing process, which shall be described.

The current path part 130 can determine the logic state of the first node by dividing the voltage of the power supply VDD according to the ratio of the turn-on resistance of the MP3, the R1, and the turn-on resistance of the MN4.

The latch part 140 includes a second inverter MP5 and MN6, NOT logic gates IC4, IC5, IC6 and IC7, a second NAND gate Nand2, a third NAND gate Nand3, and a fourth NAND gate Nand4.

The second inverter MP5 and MN6 is complementarily connected to the PMOS transistor MP5 and the NMOS transistor MN6. The gates of the MP5 and the MN6 are connected to the first node N1 to inversely amplify the first node voltage. The first node voltage amplified is output to the second node N2 and used as the input signal to the second NAND gate Nand2, the inverter IC5, and the fourth NAND gate Nand4.

The second NAND gate Nand2 receives the second node signal and the PoR signal. The output signal of the second NAND gate Nand2 is inverted by the inverter IC4 and controls the turn-on or turn-off of the MP3 of the current path part 130. The third NAND gate Nand3 receives the inverted signal of the second node signal via the inverter IC5 and the PoR signal, and the output signal of the third NAND gate Nand3 controls the turn-on or turn-off of the MN4. The fourth NAND gate Nand4 receives the second node signal and the external data signal via the inverters IC2 and IC3.

Based on the structure of the fusing cell 100 as aforementioned, the functions of the fusing cell 100 of FIG. 3 are explained.

At the initial stage without the fusing process, the fusing enable (Fenb) signal is high, the gate of the inverter MP1 and MN2 which enables the current driving transistor MN0 is high regardless of the external data Denb, and the node a is low. Thus, the MN0 is disabled.

In the power-on reset, the PoR signal is low. Hence, the gate of the MP3 is low regardless of the logic state of the second node, and the gate of the MN4 is high. The MP3 and the MN4 are turned on, and the MP3, the R1, the MN4, and the fusing part 110 build the current path. The second node voltage is determined by the ratio of the turn-on resistance of the MP3, the R1, the turn-on resistance of the MN4, and the fusing resistance, which is given by the following equation:

$$V_{N1} = VDD \times \frac{R_{MN4} + R_{fp}}{R_{MP3} + R_1 + R_{MN4} + R_{fp}} \quad \text{[Equation 1]}$$

Equation (1), $V_{N1}$ is the first node voltage, VDD is the voltage supplied from the power supply, $R_{MP3}$ is the turn-on resistance of the MP3, $R_{MN4}$ is the turn-on resistance of the MN4, and $R_{fp}$ is the fusing resistance.

$R_{fp}$ without the fusing is several ~tens of ohm and rarely affect $V_{N1}$. Accordingly, $V_{N1}$ is determined by the reference resistance R1 and the turn-on resistances of the MOS transistors MP3 and MN4, which is about tends ~hundreds of mV (below 500 mV). Without the fusing, the latch part 140 including the second inverter MP5 and the MN6 recognizes the first node voltage below about 500 mV as the logic state of Low. In result, the second node voltage $V_{N2}$ is high.

When the second node voltage is high, the output Do outputs the inverted signal of the external data Denb signal. When the initial value of Do is set to 1 (high), the fusing resistance $R_{fp}$ can be set to several Kohm ~infinity by fusing the fusing cell 100. Since the value to fuse through the output $D_0$ is high, Denb of '0' can be input. When '0' is input to Denb, one input of the first NAND gate is high according to the inverter IC2. In so doing, when the signal of the low logic state is applied to the fusing enable (Fenb), the gate of the current driving transistor MN0 has the high value. Thus, the MN0 is turned on and instantaneously flows to the current the fusing part 110, thus performing the fusing process. The fusing current disconnects the fussing resistor.

When the fusing current, which is the instant current, flows to the fusing part 110, the fusing resistor mostly burns and thus increases the resistance. In this respect, it is preferable to design the latch part 140 including the second inverter MP4 and MN6 to recognize that the fusing resistance is fused even with the resistance over 1 Kohm. The fusing process is carried out in a package test time. Naturally, given a greater number of the fusing resistors in the fusing part 110, the fusing yield influences the package yield. It is preferable to fuse even when the fusing resistor is not completely disconnected in the fusing process and only the resistance increases.

When the fusing cell 100 conducts the fusing, the resistance of the fusing part 110 increases. Thus, the voltage of the first node (the first node is low without the fusing) is greater than 500 mV, and the logic state of the first node transits to high. When the first node is high, the second node is low. When the second node is low, one input of the fourth NAND gate Nand4 is low and the output $D_0$ outputs high. That is, when the second node is low, the output $D_0$ outputs high irrespective of the logic state of the external data Denb.

The fusing performance of the fusing cell 100 of the present invention relies on the instant current supply capability which determines how much current can be supplied instantaneously to the fusing resistor when the current driving transistor MN0 is turned on, and the structure of the fusing resistor. The instant current supply capability indicates the current supply capability of the current driving transistor MN0. When the size of the MN0 is greater than a certain size, the current close to 100 mA can be flowed to the fusing resistor instantaneously.

After the fusing process of the fusing cell 100, the fusing resistor can use a poly layer to attain a high resistance. It is necessary to carefully design the size of the first inverter MP1 which enables the current driving transistor MN0, and the metal resistor of the fusing part 110 and the VSS PAD in the layout.

According to the present invention, in the normal mode where the PoR signal is high, the current consumed by the fusing cell 100 itself is close to zero. When the fusing cell 100 operates in the sleep mode and itself consumes the current, in consideration of the current consumption below several uA, it cannot meet the specification of the chip.

The current consumption close to '0' in the operation mode of the fusing cell 100 is now explained by referring to FIG. 3. In the normal mode (the PoR signal is high), the fusing cell 100 approximates its current consumption to zero using the latch part 140.

When the fusing cell 100 operates in the power-on reset interval (the PoR signal is low), the first node has the voltage value below 500 mV and the latch part 140 including the second inverter MP5 and MN6 recognizes the voltage of the first node as low as stated earlier. Since the first node is low, the second node is high. At this time, as the current driving transistor MN0 is turned off, it cannot supply the fusing current to the fusing part 110. Without the fusing, the MP3, the R1, the MN4, and the fusing resistor establish the current path between the power supply VDD and the ground plane so that the current flows from the power supply VDD in the direction of the ground plane. The first node is low, and the second node is high. When the high signal is applied to the PoR terminal while the current still flows, the fusing cell 100 operates in the normal mode. At this time, since the second node is high and the PoR is high, the MP3 is turned off and the MN4 is turned on to thus disconnect the current path. When the current path is cut off, the first node voltage is 0 like the ground plane and the logic state is low. When the first node is low, the second node sustains the stabilized high.

When the current driving transistor MN0 is turned on, the instant current flows to the fusing part 110, and the fusing cell 100 performs the fusing, the first node is high and the second node is low. Since the second node is low and the PoR is high (in the normal mode), the MP3 is turned on and the MN4 is turned off. In result, the current path built with the MP3, the R1, the MN4, and the fusing resistor is cut off. When the current path is broken, the first node becomes VDD and is high and the second node becomes the stabilized low.

By means of the fusing cell 100 of the present invention, the current consumption of the fusing cell 100 itself is almost close to zero in the stable operation mode excluding the current consumption of the initial fusing interval.

According to the present invention, the test time taken to correct the process variation of the semiconductor device can be reduced.

Using the fusing cell, the current consumption can be greatly reduced in the fusing process.

Further, the simplified structure of the fusing cell and the logic similar to the conventional flip-flop can lower the manufacturing cost.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A fusing apparatus for correcting process variation, comprising:
    a fusing part comprising a fusing resistor, which is fused by a fusing current;
    a current driving transistor that fuses the fusing resistor by driving said fusing current according to a fusing enable signal applied during an initial fusing time;
    a current path part that builds a current path by connecting to the fusing part only during said initial fusing time, and that controls a first node voltage according to a fusing state of the fusing resistor; and
    a latch part that latches a second node signal inversely amplified from the first node voltage, that controls said current path part based on said inversely amplified signal, and that outputs the latched second node signal during a normal mode.

2. The apparatus of claim 1, further comprising:
    an input logic gate part that outputs a low logic state regardless of an external data value when the fusing enable signal state is high; and
    a first inverter comprising a PMOS transistor and an NMOS transistor connected to an output terminal of the input logic gate part with a gate, connected to a gate of the current driving transistor with a drain, and enabling the current driving transistor by controlling the logic state of the gate of the current driving transistor.

3. The apparatus of claim 2, wherein the input logic gate part comprises:
    a first NAND gate for receiving an inverted signal of the fusing enable signal and an inverted signal of the external data signal; and
    an inverter for inverting the inverted signal of the external data signal.

4. The apparatus of claim 1, wherein the current driving transistor is connected to an output terminal of the first inverter with a gate, connected to a power supply with a drain, connected to the fusing part with a source, and supplies the fusing current to the fusing part when the gate logic is high.

5. The apparatus of claim 1, wherein the current path part comprises:
    a PMOS transistor connected to a power supply with a source and connected to the latch part with a gate;
    a NMOS transistor connected to the first node with a drain and connected to the latch part with a gate; and
    a reference resistor connected between the drain of the NMOS transistor and the drain of the PMOS transistor, and
    wherein a current path is established or disconnected between a power supply and the fusing part according to logic states of the gate of the PMOS transistor and the gate of the NMOS transistor connected to the latch part.

6. The apparatus of claim 5, wherein, when the fusing part is not fused and the power-on reset signal is high, the PMOS transistor is turned off and the NMOS transistor is turned on so that the current path is cut, and the first node sustains low.

7. The apparatus of claim 5, wherein, when the fusing part is fused and the power-on reset signal is high, the PMOS transistor is turned on and the NMOS transistor is turned off so that the current path is cut, and the first node sustains high.

8. The apparatus of claim 1, wherein the latch part comprises:
    a second inverter comprising a PMOS transistor and an NMOS transistor connected to the first node with a gate for inversely amplifying the gate voltage and outputting the amplified gate voltage to a second node;
    a second NAND gate for receiving the power-on reset signal and the second node signal;
    an inverter for inverting an output signal of the second NAND gate and connected to the gate of the PMOS transistor of the current path part with an output terminal;
    a third NAND gate connected to the gate of the NMOS transistor of the current path part with an output terminal, and receiving the power-on reset signal and the inverted signal of the second node signal; and
    a fourth NAND gate for latching the second node voltage by receiving the second node signal and an external data signal, and outputting the latch value.

9. The apparatus of claim 1, wherein, when the fusing resistor is fused by the fusing current, the logic state of the first node voltage is changed to high.

10. The apparatus of claim 9, wherein the resistance of the fusing resistor may exceed 0 ohm, but not exceed 40 ohm.

* * * * *